United States Patent
Lu et al.

(10) Patent No.: US 9,640,484 B2
(45) Date of Patent: May 2, 2017

(54) SEMICONDUCTOR DEVICE AND MANUFACTURING METHOD THEREOF

(71) Applicant: UNITED MICROELECTRONICS CORP., Hsin-Chu (TW)

(72) Inventors: Chia-Lin Lu, Taoyuan (TW);
Chun-Hsien Lin, Tainan (TW);
Chun-Lung Chen, Tainan (TW);
Kun-Yuan Liao, Hsin-Chu (TW);
Feng-Yi Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/882,424

(22) Filed: Oct. 13, 2015

(65) Prior Publication Data

US 2017/0077031 A1    Mar. 16, 2017

(30) Foreign Application Priority Data

Sep. 16, 2015 (CN) .......................... 2015 1 0589504

(51) Int. Cl.
| | |
|---|---|
| *H01L 23/535* | (2006.01) |
| *H01L 29/78* | (2006.01) |
| *H01L 29/06* | (2006.01) |
| *H01L 29/165* | (2006.01) |
| *H01L 29/16* | (2006.01) |
| *H01L 29/24* | (2006.01) |
| *H01L 29/161* | (2006.01) |

(Continued)

(52) U.S. Cl.
CPC ...... *H01L 23/535* (2013.01); *H01L 21/26513* (2013.01); *H01L 29/0653* (2013.01); *H01L 29/0847* (2013.01); *H01L 29/16* (2013.01); *H01L 29/161* (2013.01); *H01L 29/165* (2013.01); *H01L 29/1608* (2013.01); *H01L 29/24* (2013.01); *H01L 29/66795* (2013.01); *H01L 29/7848* (2013.01); *H01L 29/7851* (2013.01)

(58) Field of Classification Search
CPC ............ H01L 21/26513; H01L 23/535; H01L 29/0653; H01L 29/0847; H01L 29/16; H01L 29/1608; H01L 29/161; H01L 29/165; H01L 29/24; H01L 29/66795; H01L 29/7848; H01L 29/7851

See application file for complete search history.

(56) References Cited

U.S. PATENT DOCUMENTS

| | | |
|---|---|---|
| 8,765,546 B1 | 7/2014 | Hung et al. |
| 9,224,736 B1 * | 12/2015 | Ching ................. H01L 27/0924 |

(Continued)

*Primary Examiner* — Allan R Wilson
(74) *Attorney, Agent, or Firm* — Winston Hsu; Scott Margo

(57) ABSTRACT

A semiconductor device and a method of manufacturing the same, the semiconductor device includes a fin shaped structure, a gate structure, an epitaxial layer, a germanium layer, an interlayer dielectric layer and a first plug. The fin shaped structure is disposed on a substrate. The gate structure is formed across the fin shaped structure. The epitaxial layer is disposed in the fin shaped structure adjacent to the gate structure. The germanium layer is disposed on the epitaxial layer. The interlayer dielectric layer covers the substrate and the fin shaped structure. The first plug is disposed in the interlayer dielectric layer to contact the germanium layer.

8 Claims, 6 Drawing Sheets

(51) Int. Cl.
    *H01L 29/08*    (2006.01)
    *H01L 29/66*    (2006.01)
    *H01L 21/265*    (2006.01)

(56) References Cited

U.S. PATENT DOCUMENTS

| | | | | |
|---|---|---|---|---|
| 2010/0258871 | A1* | 10/2010 | Ishigaki | H01L 29/785 257/347 |
| 2012/0199890 | A1 | 8/2012 | Hung et al. | |
| 2013/0285141 | A1* | 10/2013 | Kuo | H01L 29/66545 257/347 |
| 2014/0124842 | A1 | 5/2014 | Wang et al. | |
| 2015/0069473 | A1 | 3/2015 | Glass et al. | |
| 2015/0097239 | A1* | 4/2015 | Chen | H01L 23/3171 257/347 |
| 2015/0115375 | A1* | 4/2015 | Yoo | H01L 29/517 257/411 |
| 2015/0255604 | A1* | 9/2015 | Yang | H01L 29/7848 257/192 |
| 2016/0027918 | A1* | 1/2016 | Kim | H01L 29/7848 257/401 |
| 2016/0211251 | A1* | 7/2016 | Liaw | H01L 27/0207 |

* cited by examiner

US 9,640,484 B2

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, a semiconductor device having a plug structure and a manufacturing method thereof.

2. Description of the Prior Art

In recent years, the critical dimension (CD) in semiconductor processes becomes finer with the increasing miniaturization of semiconductor devices. However, as the CD of the semiconductor device is continuously shrunk, the integrated process of forming a semiconductor device having metal gate also faces more challenges and limitations.

As the semiconductor industry has progressed into nanometer technology process nodes in pursuit of highly integrated and high-speed operation, current techniques utilize miniaturized through holes and inter-layer dielectric layers to form a multilayered interconnected wiring structure to electrically connect a metal gate and source/drain regions of a transistor, thereby providing signal input/output pathways for the transistor. However, the current photoresist and lithography techniques are no longer qualified enough to support the currently integrated process while forming the metal gate and contact plug. For example, the position shift of the contact plug electrically connected to the source/drain regions easily occurs, which may directly penetrate the metal gate, thereby affecting the electrical performance of the entire device. For these reasons, how to efficiently improve the current structure of the semiconductor device, as well as the method of forming the same, has become an important task in this field.

SUMMARY OF THE INVENTION

It is one of the primary objectives of the present invention to provide a method of forming a semiconductor device having a plug structure, so as to improve the electrical performance of the entire semiconductor structure.

It is another one of the primary objectives of the present invention to provide a semiconductor device having a plug structure, in which a germanium layer is disposed on a source/drain region thereof, thereby being able to improve the electrical performance of the entire semiconductor structure.

To achieve the purpose described above, the present invention provides a method of forming a semiconductor device including following steps. First of all, a substrate having a fin shaped structure formed thereon is provided. Next, a gate structure is formed across the fin shaped structure. Then, an epitaxial layer is formed in the fin shaped structure, adjacent to the gate structure, and an interlayer dielectric layer is formed on the gate structure and the fin shaped structure. Following these, a first opening is formed in the interlayer dielectric layer to expose the epitaxial layer, and a germanium layer is formed on the epitaxial layer.

To achieve the purpose described above, the present invention provides a semiconductor device including a fin shaped structure, a gate structure, an epitaxial layer, a germanium layer, an interlayer dielectric layer and a first plug. The fin shaped structure is disposed on a substrate. The gate structure is formed across the fin shaped structure. The epitaxial layer is disposed in the fin shaped structure adjacent to the gate structure. The germanium layer is disposed on the epitaxial layer. The interlayer dielectric layer covers the substrate and the fin shaped structure. The first plug is disposed in the interlayer dielectric layer to contact the germanium layer.

According to the above, the semiconductor device and the forming method thereof in the present invention mainly performs a selective epitaxial growth process right after forming the opening of exposing the source/drain region, to form a germanium layer completely covering the top surfaces of the source/drain region. With such performance, the germanium layer may protect the source/drain region underneath in the subsequent etching processes for forming other openings, so as to avoid the exposure of the source/drain region, and to avoid damage to the source/drain region. Please note that, the germanium layer preferably has a proper thickness, for example being between about 30 nanometers (nm) to 60 nm, so that, the germanium layer may be disposed at a position being not over about half height of the gate structure, thereby preferably protecting the source/drain region underneath without affecting the formations of any other elements formed subsequently, like plug structure for example.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 11 are schematic diagrams illustrating a method of forming a semiconductor device according to a first embodiment of the present invention, wherein FIG. 1, FIG. 6 and FIG. 10 show top views of the semiconductor device in forming steps, and FIG. 2, FIG. 7 and FIG. 11 show cross-sectional views taken along a cross line A-A' in FIG. 1, FIG. 6 and FIG. 10.

DETAILED DESCRIPTION

To provide a better understanding of the present invention, preferred embodiments will be described in detail. The preferred embodiments of the present invention are illustrated in the accompanying drawings with numbered elements.

Figure 1:
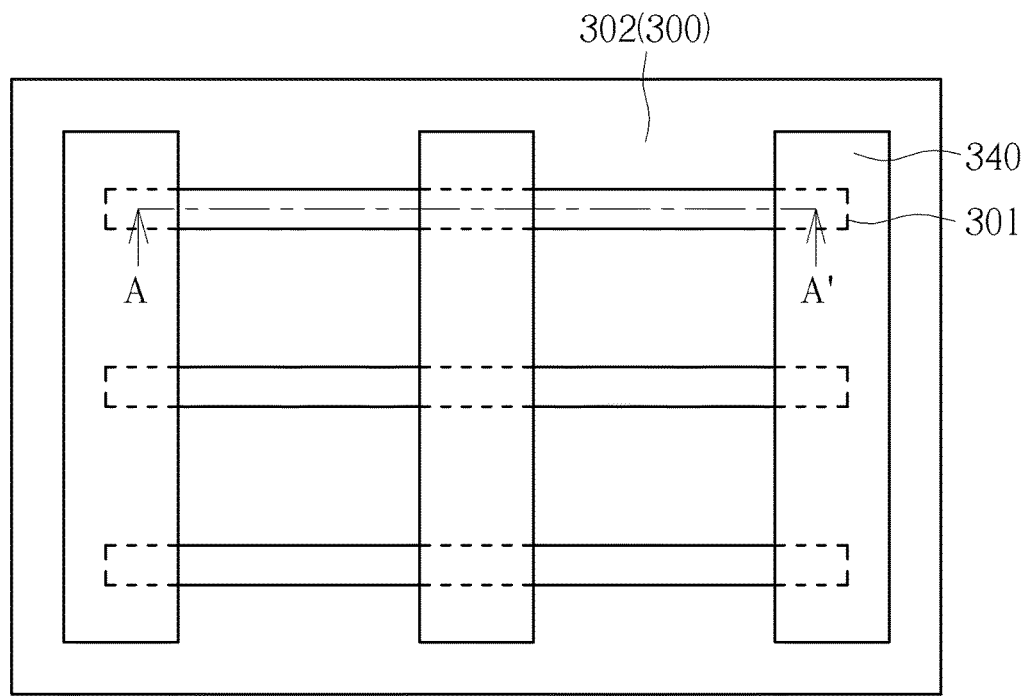
Figure 2:
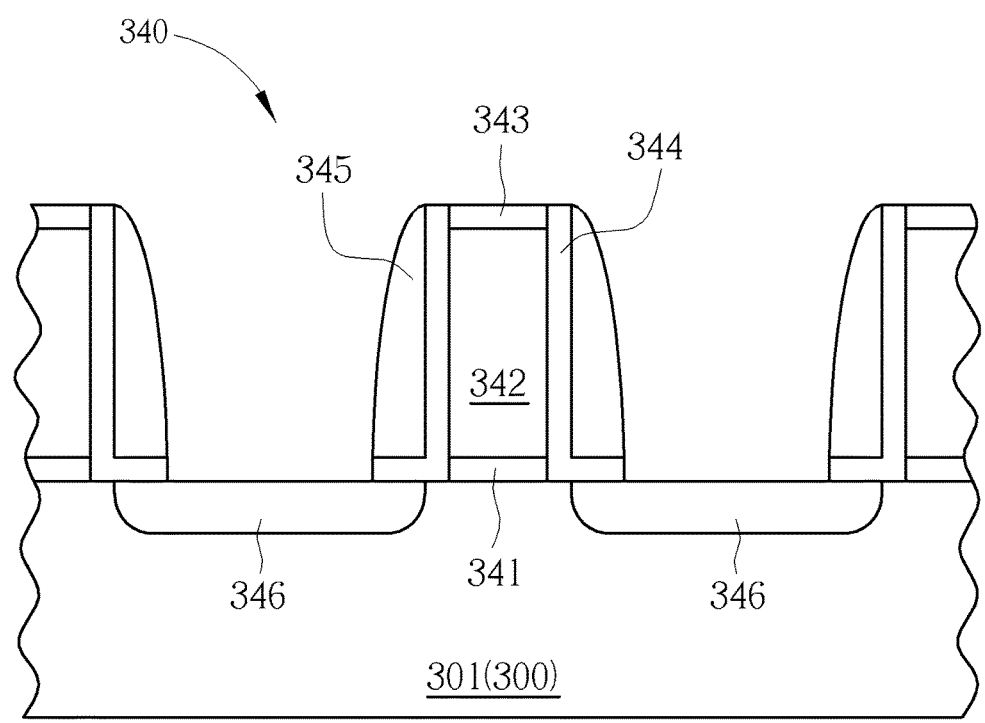
Figure 4:
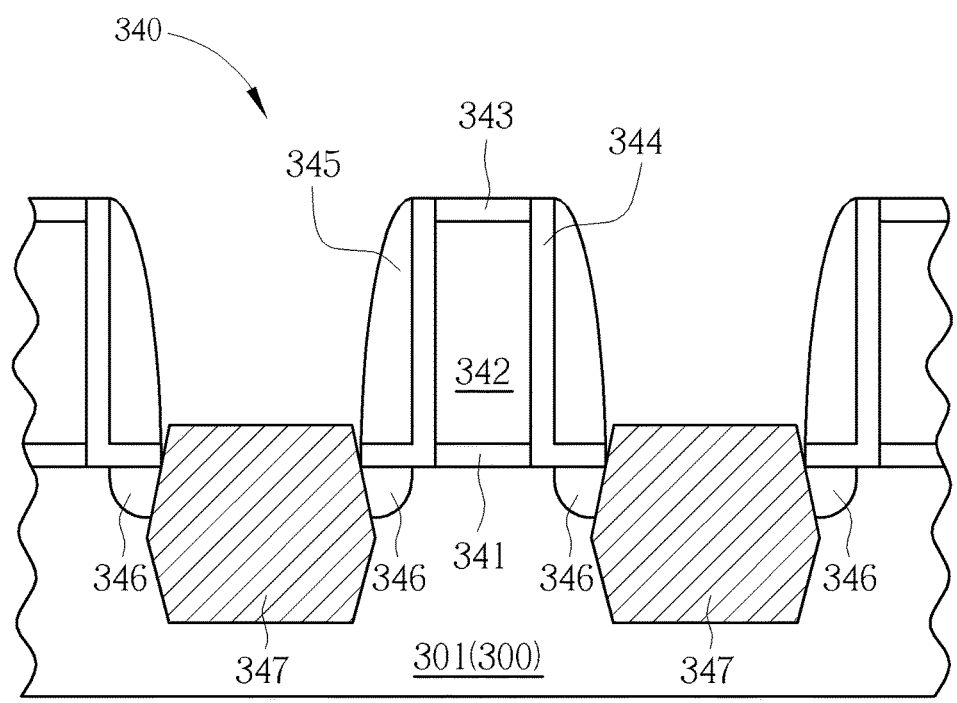
Figure 5:
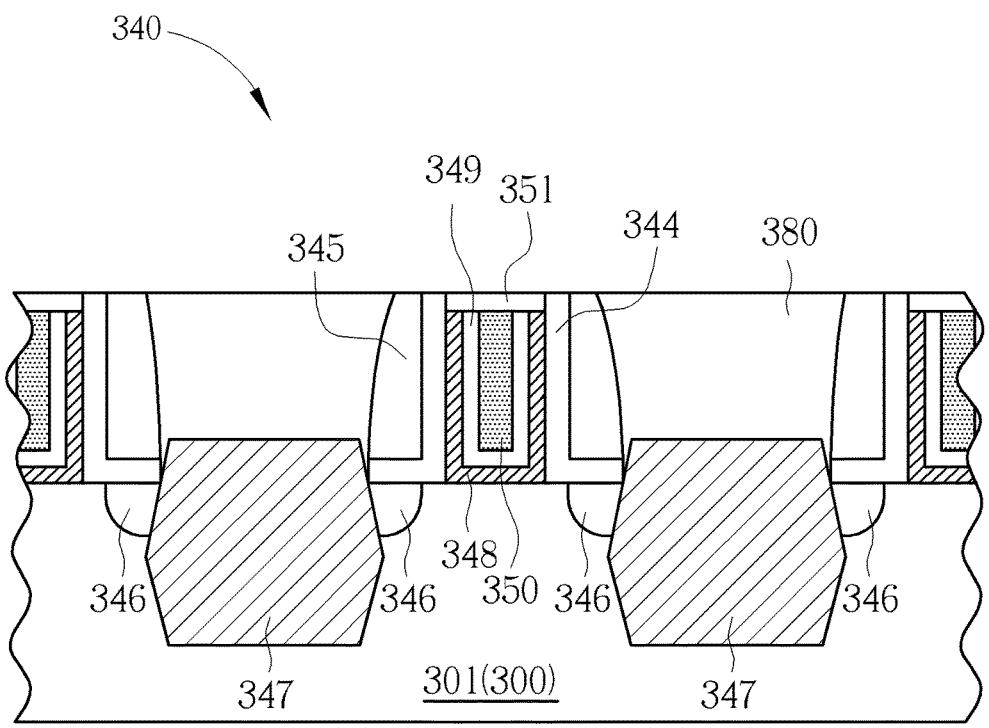
Figure 6:
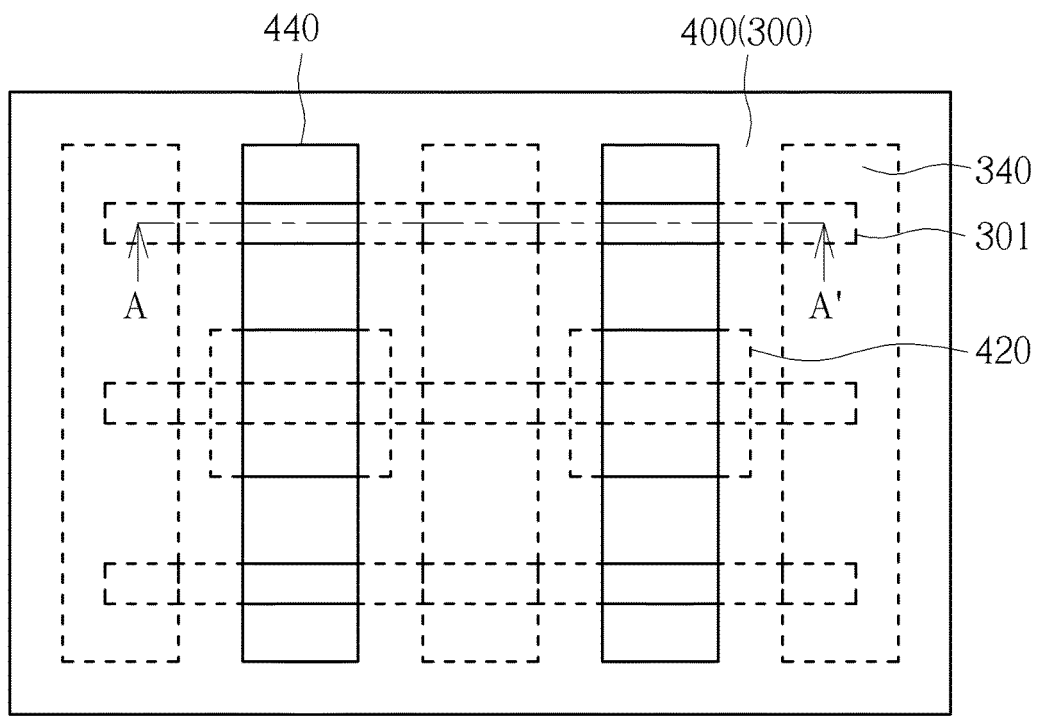
Figure 7:
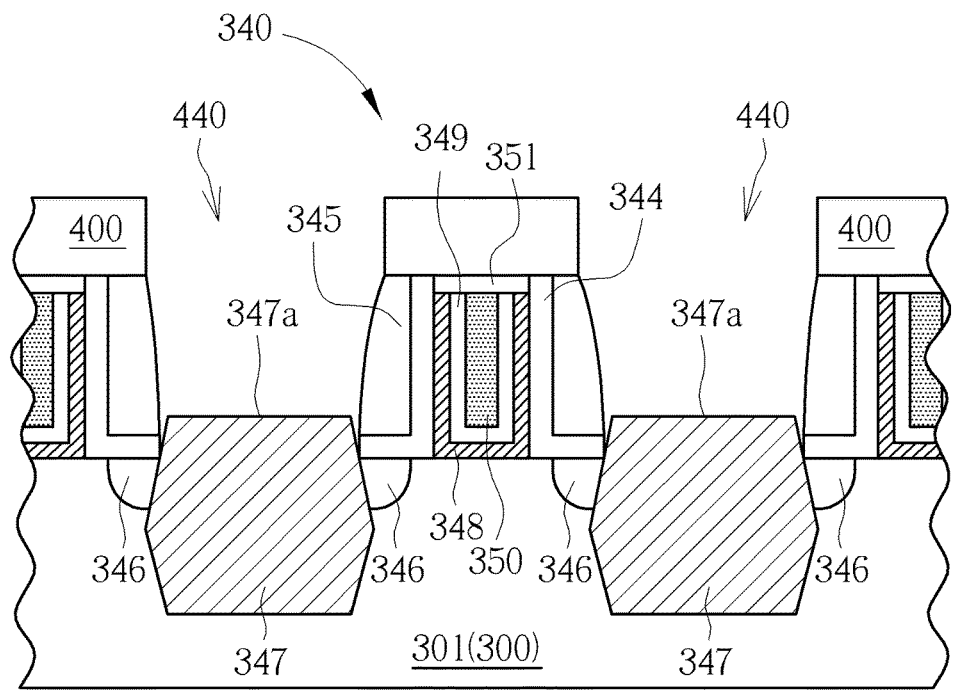
Figure 8:
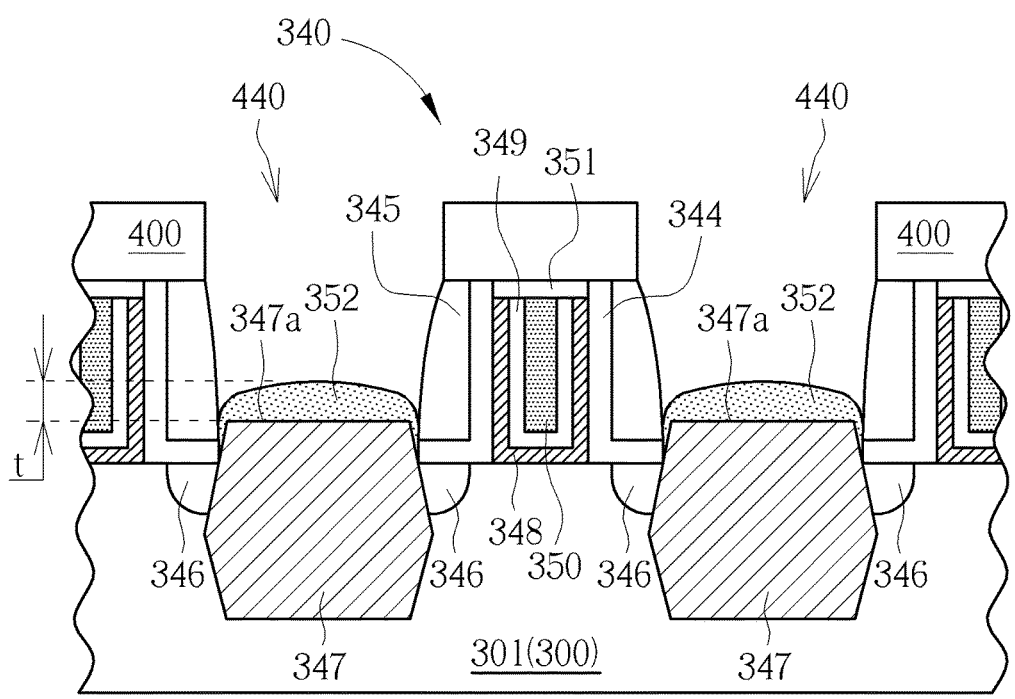
Figure 9:
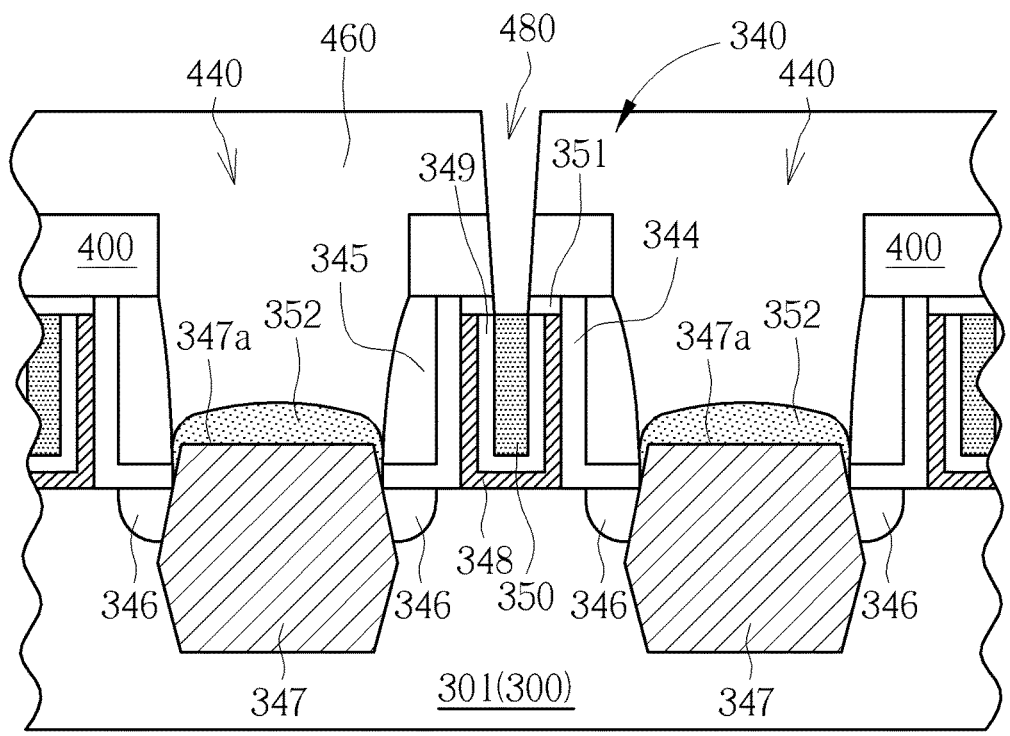
Figure 10:
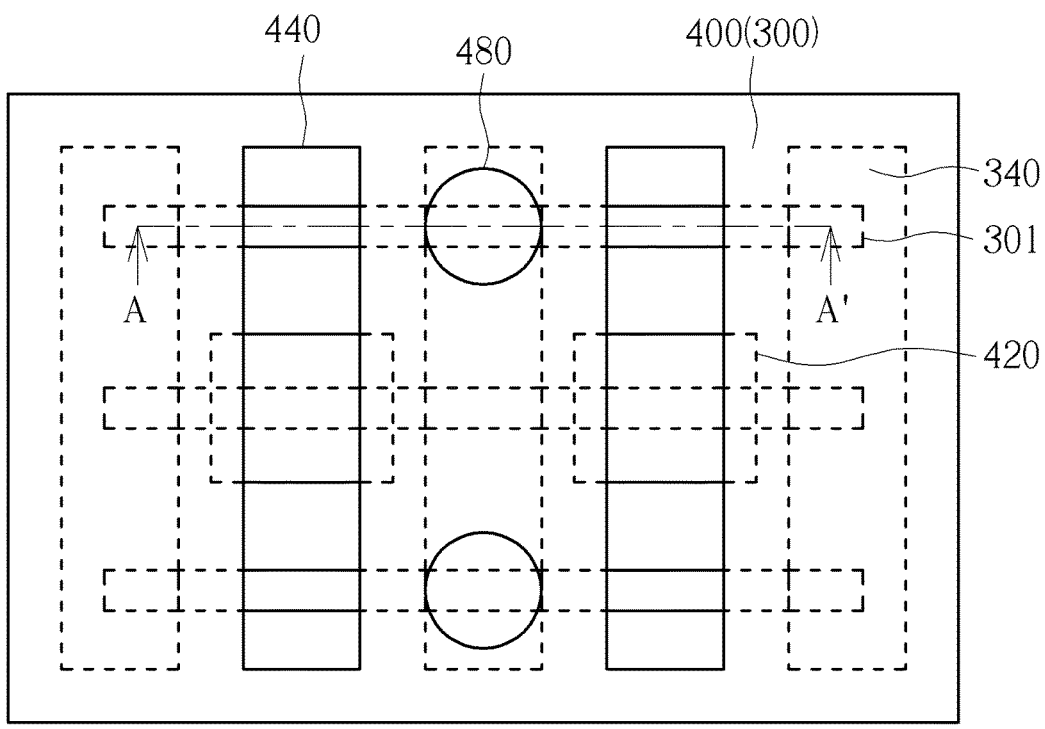
Figure 11:
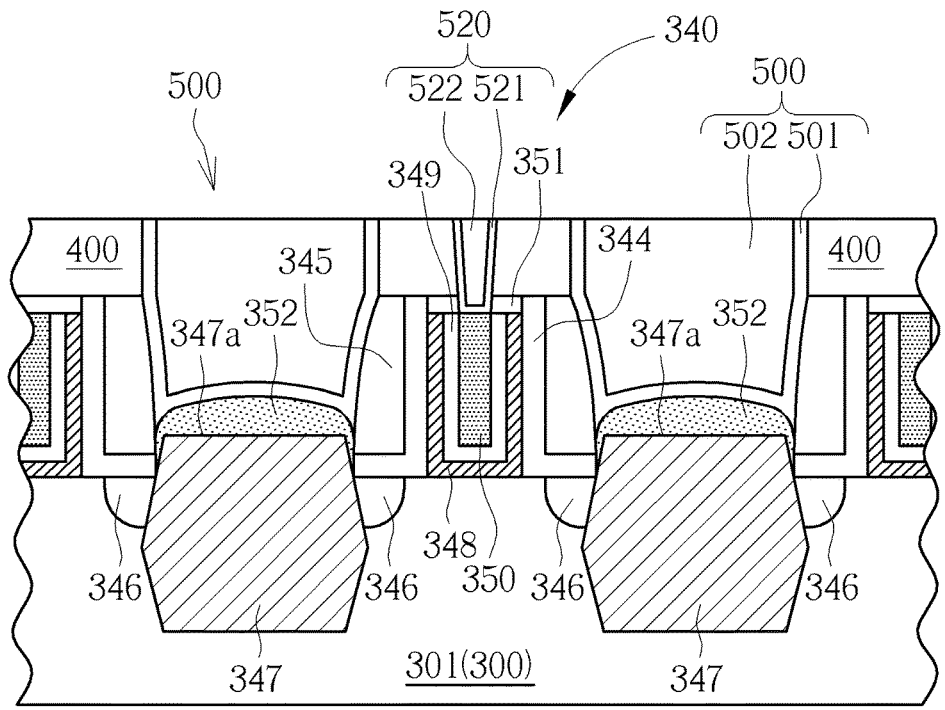

Please refer to FIG. 1 to FIG. 11, which schematically illustrate a method of forming a semiconductor device in accordance with a first embodiment of the present invention, wherein FIG. 1, FIG. 6 and FIG. 10 show top views of the semiconductor device in forming steps, and FIG. 2, FIG. 7 and FIG. 11 show cross-sectional views taken along a cross line A-A' in FIG. 1, FIG. 6 and FIG. 10. Firstly, a substrate 300 is provided, like a silicon substrate, epitaxial silicon substrate, silicon germanium substrate, silicon carbide substrate or silicon on insulation (SOI) substrate, for example. Also, at least one fin shaped structure 301 may be formed on the substrate 300, and at least one gate structure 340 is formed across the fin shaped structure 301. Please note that, although the present embodiment is exemplified by forming three fin shaped structures 301, the number of the fin shaped structure 301 is not limited thereto, and may be further adjusted according to the practical requirement. For example, in another embodiment one or more than one fin shaped structure 301 may also be formed on the substrate 300.

Precisely, the formation of the fin shaped structure 301 may include a general photolithographic etching pattern (PEP) process or a multi-patterning process, preferably through a self-aligned double-patterning (SADP) process, also known as sidewall image transfer (SIT) technique, to form a plurality of shallow trenches (not shown in the drawings) in the substrate 300. Then, an insulating layer may be filled in the trenches, so that, a portion of the substrate 300 may protrude from the insulating layer to form the fin shaped structure 301 and the insulating layer may form shallow trench isolations (STI) to surround the fin shaped structure 301, as shown in FIG. 1. However, the forming method of the fin shaped structure 301 in the present invention is not limited thereto, and in another embodiment of the present invention, the formation of the fin shaped structures 301 may also be accomplished by first forming a patterned hard mask (not shown in the drawings) on the substrate 300, and then performing an epitaxial process on the exposed substrate 300 through the patterned hard mask to form a semiconductor layer (not shown in the drawings), such as silicon or silicon germanium layer, thereby being used as the corresponding fin shaped structure. Otherwise, in another embodiment, the fin shaped structure may also be omitted, and a gate structure (not shown in the drawings) may be formed directly on a planar substrate (not shown in the drawings).

Turning next, the gate structure 340 is formed on the substrate 300. In one embodiment, the gate structure 340 includes a gate dielectric layer 341, a dummy gate 342, a capping layer 343, a liner 344, a spacer 345 and a light doped drain (LDD) region 346. The gate dielectric layer 341 may include silicon oxide or silicon nitride (SiN). The dummy gate 342 may include polysilicon, for example including undoped polysilicon, doped polysilicon, amorphous silicon or a composite material of the combination thereof. The capping layer 343 may include a multilayer structure, as shown in FIG. 2, for example including silicon dioxide ($SiO_2$), silicon carbide (SiC), SiN, oxynitride (SiON) or a composite material of the combination thereof, and in another embodiment, the capping layer 343 may also be a monolayer of the above mentioned materials, however. The liner 344 may include silicon oxide. The spacer 345 may also include a monolayer structure or a multilayer structure optionally, for example including high temperature oxide (HTO), SiN, silicon oxide, SiON or SiN formed by hexachlorodisilane ($Si_2Cl_6$) (HCD-SiN), but is not limited thereto.

Precisely speaking, in one embodiment of the present invention, the method of forming the gate structure 340 may include the following steps. First of all, a gate dielectric material layer (not shown in the drawings), a dummy gate material layer (not shown in the drawings) and a capping material layer (not shown in the drawings) are sequentially stacked on the substrate 300, and then the stacked layers are patterned to form a gate stack structure (not shown in the drawings). Then, the liner 344 is formed at sidewalls of the gate stack structure, the LDD region 346 is formed in the fin shaped structure 301 (substrate 300) at two sides of the gate stack structure, and the spacer 345 is finally formed on sidewalls of the liner 344, thereby forming the gate structure 340.

Figure 3:
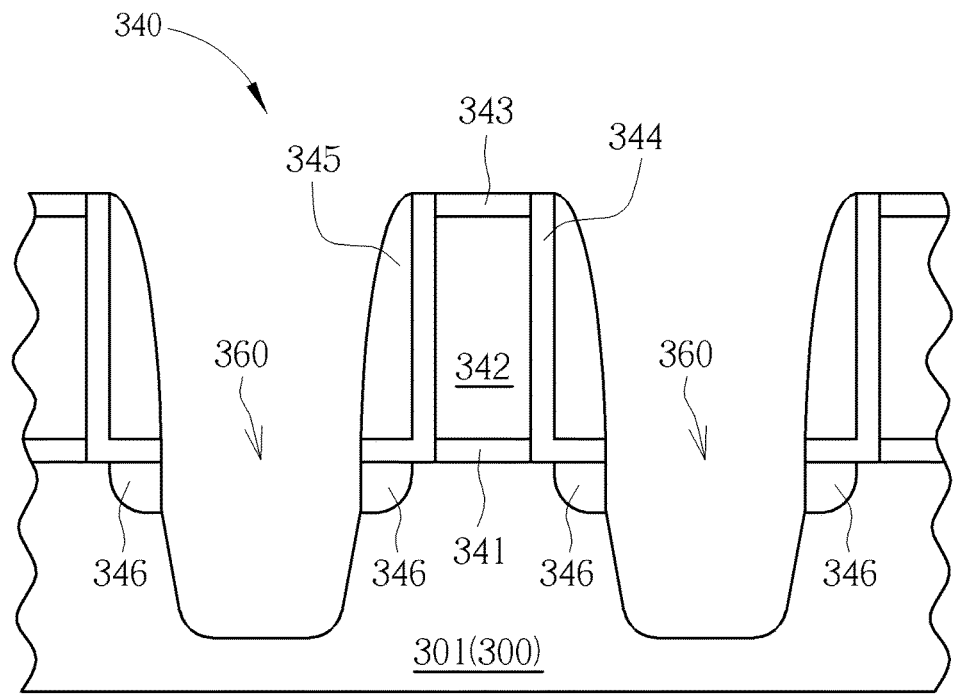

Subsequently, an epitaxial layer 347 is formed in the fin shaped structure 301, at two side of the gate structure 340, thereby being adjacent to the gate structure 340 to function like source/drain regions. Precisely, an etching process, like a dry etching process, a wet etching process of a sequent performed dry and wet etching process for example, is firstly performed to form a recess 360 in the fin shaped structure 301, at two sides of the gate structure 340, as shown in FIG. 3. Then, a selective epitaxial growth (SEG) process is performed to form an epitaxial layer 347 in the recess 360, as shown in FIG. 4.

In the present embodiment of the present invention, the material of the epitaxial layer 347 may be adjusted according to the type of the MOS transistor formed in the subsequent steps. For example, when the MOS transistor is a PMOS, the epitaxial layer 347 may include silicon germanium (SiGe), silicon-germanium-boron (SiGeB), or silicon-germanium-tin (SiGeSn). Also, a P type dopant may be in-situ implanted into the epitaxial layer 347 during the SEG process, to form a $P^+$ epitaxial layer thereby, such that, the following ion implantation process for forming the source/drain of PMOS may be omitted. On the other hand, in another embodiment of the present invention, when the MOS transistor is NMOS, the epitaxial layer 347 may include silicon carbide (SiC), silicon carbide-phosphate (SiCP), or silicon phosphate (SiP). Likewise, an N type dopant may also be in-situ implanted into the epitaxial layer 347 during the SEG process, to form an $N^+$ epitaxial layer thereby, but is not limited thereto. However, in one embodiment, an additional ion implantation process may be performed, to form the source/drain in the epitaxial layer 347 either before or after the epitaxial layer 347 is formed. In another embodiment, the dopants or heterogeneous atoms, like germanium or carbon atoms for example, may be altered in a gradual arrangement; or the epitaxial layer may be omitted, to directly perform the ion implantation process in the fin shaped structure 301 or the substrate, at two sides of the gate structure 340, to form source/drain regions thereby.

Following these, after forming an interlayer dielectric (ILD) layer 380 on the substrate 300, a replacement metal gate (RMG) process is performed to replace the dummy gate 342 of the gate structure 340 with a metal gate. In the present embodiment, the method of forming the metal gate may include entirely forming an interlayer dielectric material layer (not shown in the drawings), such as a silicon oxide layer, on the substrate 300, to completely cover the gate structure 340. Then, a planarization process is carried out, such as a chemical mechanical polish (CMP) process, an etching back process or a combination of both, to remove a portion of the interlayer dielectric material layer up to the exposure of the gate structure 340, and to remove a portion of the liner 344, a portion of the spacer 345, and the capping layer 343, to form the ILD layer 380 thereby.

Subsequently, the dummy gate 342 and the gate dielectric layer 341 are removed by using a selective dry etching or wet etching, to form a gate recess (not shown in the drawings). Finally, a high dielectric constant (high-k) layer (not shown in the drawings), a work function metal material layer (not shown in the drawings) and a low-resistance metal material layer (not shown in the drawings) are sequentially formed in the gate recess, and another CMP process is carried out to remove the above-mentioned layers that are outside the gate recess, thereby forming a gate dielectric layer (not shown in the drawings), a work function metal layer (not shown in the drawings), and a metal layer (not shown in the drawings). Finally, an etching back process is performed, to remove a portion of the gate dielectric layer, a portion of the work function metal layer, and a portion of the metal layer, and to form a gate dielectric layer 348, a work function metal layer 349 and a metal layer 350, as shown in FIG. 5. Then, a cap layer 351 is formed.

However, the metal gate of the present invention is not limited to being formed through the above-mentioned steps, and may include other forming methods which are well known by one skilled in the art. For example, in one embodiment of the present invention, a bottom barrier material layer (not shown in the drawings), like a titanium/titanium nitride (Ti/TiN) layer or a tantalum/tantalum nitride (Ta/TaN) layer for example, may be further formed between the high dielectric constant layer and the work function metal material layer; or a top barrier material layer (not shown in the drawings) substantially including similar materials as that of the bottom barrier material layer, may be further formed between the work function metal material layer and the low-resistance metal material layer, but not limited thereto. The bottom barrier material layer and the top barrier material layer may form a bottom barrier layer (not shown in the drawings) and/or a top barrier layer (not shown in the drawings) only disposed in the gate trench also through the CMP process.

Additionally, in one embodiment of the present invention, the gate dielectric layer 348 for example includes a high dielectric constant (high-k) material, like hafnium oxide ($HfO_2$), hafnium silicon oxide ($HfSiO_4$) or hafnium silicon oxynitride (HfSiON); and the work function metal layer 349 is preferably configured to adjust the work function of the metal gate and the material thereof may be adjusted according to the type of the MOS transistor. For example, when the MOS transistor is NMOS, the work function metal layer 349 may include metal materials having a work function being between 3.9 eV and 4.3 eV, such as TiAl, ZrAl, WAl, TaAl, HfAl or TiAlC, but not limited thereto; or when the MOS transistor is PMOS, the work function metal layer 349 may include metal materials having a work function being between 4.8 eV and 5.2 eV, such as TiN, TaN, or TaC, but not limited thereto. The metal layer 350 may include aluminum (Al), Ti, Ta, or tungsten (W), but not limited thereto.

Furthermore, the gate structure 340 of the present invention is not limited to being formed through the above-mentioned steps, and may include other methods which are well known by one skilled in the art. For example, in one embodiment of the present invention, a monolayer or multilayer contact etch stop layer (CESL, not shown in the drawings) may be optionally formed on the substrate 300, before the interlayer dielectric material layer is formed, for further providing required compressive stress or tensile stress to the channel of the gate structure 340. Meanwhile, although the gate structure 340 of the present embodiment is exemplified as a "gate-last" process and a "high-k last" process, in another embodiment, the gate structure may also be formed through a "gate-first" process or a "high-k first" process, or a metal gate structure (not shown in the drawings) may also be directly formed on the substrate, wherein the metal gate structure at least includes a work function metal layer (not shown in the drawings) and a metal gate (not shown in the drawings). Otherwise, when the primary gate structure may be adequate for the product requirements, the replacement metal gate process may also be omitted optionally.

Following these, a contact opening etching process is carried out. Precisely, an interlayer dielectric (ILD) layer 400 is firstly formed on the ILD layer 380, and the ILD layer 400 may include the same material to the ILD layer 380 or other suitable dielectric materials. Then, at least one contact opening 440 is formed in the ILD layer 400 and the ILD layer 380 to expose the epitaxial structure 347 (namely, the source/drain regions) underneath. The contact opening etching process may be performed through a photolithographic etching process, for example including firstly forming a slot cut pattern 420 and a patterned photoresist layer (not shown in the drawings) partially overlapped the slot cut pattern 420 on the ILD 400, and performing an etching process by simultaneously using the slot but pattern 420 and the patterned photoresist layer as a mask, to remove a portion of the ILD 400 and the ILD 380 at the two sides of the gate structure 340, thereby forming a plurality of openings 440 to expose the epitaxial layer 347 (namely, the source/drain regions), as shown in FIG. 6. It is worth noting that, in the present embodiment, the slot cut pattern 420 is disposed right across below at least one opening pattern of the patterned photoresist layer, and partially overlaps the openings 440 in a projection direction, so that, the slot cut pattern is able to divide the opening 440 into two parts, as shown in FIG. 6.

It is also worth noting that, the openings 440 of the present embodiment preferably include a greater diameter, such that, the spacers 345 and a top surface 347a of the epitaxial layer 347 (namely, the source/drain regions) may be completely exposed thereby, as shown in FIG. 7. In other words, the openings 440 are actually defined by the spacers 345 and the top surface 347a of the epitaxial layer 347. Then, a cleaning process may be carried out optionally, to remove the residue of the aforementioned photolithographic etching process remaining in the openings 440.

After that, another selective epitaxial growth process is performed, to form a germanium layer 352 on the top surface 347a of the epitaxial layer 347 (namely, the source/drain regions). Precisely, the germanium layer 352 is formed on the whole surfaces of epitaxial layer 347 (namely, the source/drain regions) exposed from the openings 440, namely, the top surfaces 347. It is noted that, the germanium layer 352 preferably has a proper thickness t, for example being about 30 nanometers (nm) to 60 nm, so that, the germanium layer 352 may be disposed at a position being not over about half height of the metal layer 350, as shown in FIG. 8. In this manner, the germanium layer 352 may not affect the formation of other elements formed in the subsequent steps.

Then, another contact opening etching process is carried out, to form an opening 480 in the ILD layer 400 to expose the gate structure 340 underneath. Precisely, a patterned sacrificial mask layer 460 having an opening pattern is formed on the ILD layer 400, to fill in the openings 440, and an etching process is carried out to remove a portion of the ILD layer 400 and a portion of the cap layer 351 of the gate structure 340, to form the opening 480 thereby, as shown in FIG. 9.

Finally, after completely removing the patterned sacrificial mask layer 460, a cleaning process may be optionally performed, for example, using argon (Ar) to clean surfaces where the openings 440, 480 are formed, for removing the etching residue, and a silicidation process is then performed in the openings 440. After that, a plug process is carried out, to form plugs 500, 520 which may direct contact and electrically connect the epitaxial layer 347 (namely, the source/drain regions) and the gate structure 340 in the openings 440, 480, respectively.

The formation of the plugs 500, 520 for example includes firstly forming a barrier material layer (not shown in the drawings) and a metal material layer (not shown in the drawings) in the openings 440, 480, and performing a planarization process, like a CMP process, an etching process or a combination of both for example, to remove a portion of the metal material layer and a portion of the barrier material layer to simultaneously form the plugs 500, 520 thereby. In this manner, the plugs 500, 520 may be level with the top surface of the ILD layer 400, and include barrier layers 501, 502 and contact metal layers 502, 522, respectively, as shown in FIG. 11. It is noted that, the plug 500 may directly contact the entire spacer 345 of the gate structure 340. Furthermore, in one embodiment of the present invention, the barrier layers 501, 521 may include a titanium layer, titanium nitride layer, tantalum layer or tantalum nitride layer; and the contact metal layer 502, 522 may include tungsten or metal having lower resistance, but not limited thereto.

Through the aforementioned steps, the semiconductor device according to the first embodiment of the present invention is provided. The method of the present invention mainly performs a selective epitaxial growth process right after forming the opening of exposing the source/drain regions, to form a germanium layer completely covering the top surfaces of the source/drain regions. With such performance, the germanium layer may protect the source/drain regions underneath in the subsequent etching processes for forming other openings, so as to avoid the exposure of the source/drain regions, and to avoid damage to the source/drain regions. Please note that, the germanium layer preferably has a proper thickness, for example being about 30 nanometers (nm) to 60 nm, so that, the germanium layer may be disposed at a position being not over about half height of the gate structure, thereby preferably protecting the source/drain regions underneath without affecting the formations of any other elements formed subsequently, like plug structure for example.

People skilled in the art shall easily realize that the semiconductor device of the present invention is not limited to being formed through the aforementioned steps, and may include other forming methods. Thus, the following description will detail other different embodiments or variant embodiments of the manufacturing method of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 12:
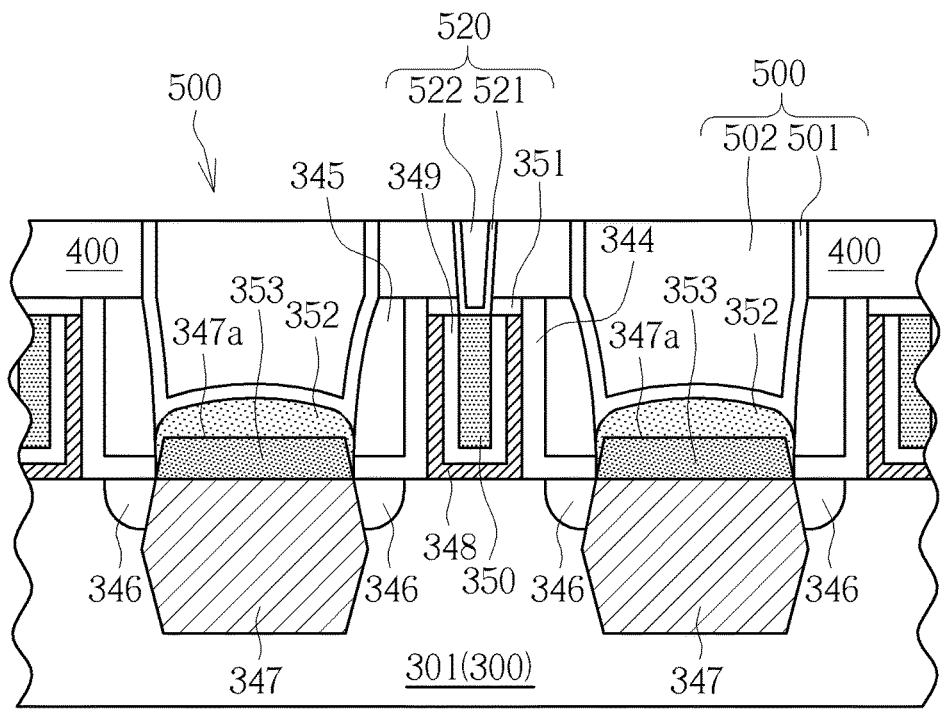
FIG. 12 is a schematic diagram illustrating a method of forming a semiconductor device according to a second embodiment of the present invention.

Please refer to FIG. 12, which is a schematic diagram illustrating a manufacturing method of a semiconductor device according to the second embodiment of the present invention. The formal steps in the present embodiment are similar to those in the aforementioned first embodiment, including sequentially forming the fin shaped structure 301, the gate structure 340, the epitaxial layer 347 (namely, the source/drain regions) and the openings 440 either on the substrate 300 or in the substrate 300. Also, it is noted that, the detailed forming methods and materials of the fin shaped structure 301, the gate structure 340, the epitaxial layer 347 and the openings 440 in the present embodiment may be substantially similar to those in the aforementioned first embodiment or be well known in the art, and may not be redundantly described herein.

The differences between the present embodiment and the aforementioned first embodiment are that, after forming the structure shown in FIG. 7 in the aforementioned first embodiment, an ion implantation process, such as a pre-amorphous implantation (PAI) process, may be performed, to implant a proper dopant in at least a portion of the epitaxial layer 347 (namely, the source/drain regions), wherein the dopant preferably include a dopant having a relative greater crystal lattice than silicon, such as germanium, but is not limited thereto. In other words, the method of the present invention performs the ion implantation process before the germanium layer 352 is formed, so as to form a germanium cap layer 353 in at least a portion of the epitaxial layer 347 (namely, the source/drain regions), preferably in at least the top portion or the whole of the epitaxial layer 347, and then, the germanium layer 352 is formed, as shown in FIG. 12. It is noted that, the germanium cap layer 353 is formed below the germanium layer 352, for further protecting the epitaxial layer 347 (namely, the source/drain regions), so as to prevent the epitaxial layer 347 from receiving any damage in the subsequent process, like a plug forming process for example. Also, in another embodiment, the dopant may also be altered in a gradual.

Following these, the forming process shown in FIGS. 8-11 of the aforementioned first embodiment may be continuously performed, and the semiconductor device according to the second embodiment of the present invention may be obtained thereby, as shown in FIG. 12. In the present embodiment, a germanium implantation process is additionally carried out before the germanium layer is formed, to form a germanium cap layer below the germanium layer, for further protecting the source/drain regions. With such performance, the present embodiment is able to avoid the exposure of the source/drain regions especially when the subsequent opening forming process is performed, thereby effectively preventing damage to the source/drain regions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a fin shaped structure disposed on a substrate;
a gate structure across the fin shaped structure;
a source/drain region disposed in the fin shaped structure adjacent to the gate structure, the source/drain region comprising an epitaxial layer;
a germanium layer disposed on the source/drain region, wherein a portion of the germanium layer is laterally sandwiched between the epitaxial layer and the gate structure;
an interlayer dielectric layer covering the substrate and the fin shaped structure; and
a first plug disposed in the interlayer dielectric layer to contact the germanium layer.

2. The semiconductor device according to claim 1, wherein the germanium layer completely covers top surfaces of the epitaxial layer.

3. The semiconductor device according to claim 1, wherein the epitaxial layer comprises SiC, SiP, SiCP, SiGe or Ge.

4. The semiconductor device according to claim 1, wherein the germanium layer has a thickness substantially being 30 nm to 60 nm.

5. The semiconductor device according to claim 1, further comprising:
a germanium cap layer disposed under the germanium layer.

6. The semiconductor device according to claim 1,
a second plug disposed in the interlayer dielectric layer to contact the gate structure.

7. The semiconductor device according to claim 1, further comprising:
   a spacer surrounding the gate structure, wherein the first plug directly contacts the spacer.

8. The semiconductor device according to claim 1, further comprising:
   a shallow trench isolation disposed in the substrate and surrounding the fin shaped structure.

\* \* \* \* \*